ized="(12) United States Patent
Powell (10) Patent No.: US 9,523,715 B2
(45) Date of Patent: Dec. 20, 2016

(54) WIRING SUBSTRATE WITH FILLED VIAS TO ACCOMMODATE CUSTOM TERMINALS

(71) Applicant: FormFactor, Inc., Livermore, CA (US)

(72) Inventor: Shawn Powell, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 377 days.

(21) Appl. No.: 13/856,091

(22) Filed: Apr. 3, 2013

(65) Prior Publication Data

US 2013/0271175 A1 Oct. 17, 2013

Related U.S. Application Data

(60) Provisional application No. 61/624,205, filed on Apr. 13, 2012.

(51) Int. Cl.
*G01R 1/073* (2006.01)

(52) U.S. Cl.
CPC ....... *G01R 1/07342* (2013.01); *G01R 1/07378* (2013.01); *H01L 2224/16225* (2013.01)

(58) Field of Classification Search
CPC ............ G01R 1/07342; G01R 1/07378; G01R 1/07307
See application file for complete search history.

(56) References Cited

U.S. PATENT DOCUMENTS

| 5,926,029 | A | * | 7/1999 | Ference et al. ............ 324/750.2 |
| 2007/0013390 | A1 | | 1/2007 | Kuitani et al. |
| 2007/0126443 | A1 | * | 6/2007 | Grube et al. ................. 324/754 |
| 2008/0186045 | A1 | * | 8/2008 | Ueda et al. ................... 324/763 |

FOREIGN PATENT DOCUMENTS

| JP | 07-191076 | 7/1995 |
| JP | 08-327659 | 12/1996 |
| JP | 2011-002408 | 1/2011 |
| KR | 10-2004-0048254 | 6/2004 |
| KR | 10-0975904 | 8/2010 |

OTHER PUBLICATIONS

PCT Application PCT/US2013/036092 "Int'l Preliminary Report on Patentability" Oct. 14, 2014 (6 pages).
PCT Application PCT/US2013/036092 "Int'l Search Report and Written Opinion of the Int'l Searching Authority" Jul. 24, 2013 (10 pages).

* cited by examiner

*Primary Examiner* — Tung X Nguyen
*Assistant Examiner* — Feba Pothen
(74) *Attorney, Agent, or Firm* — Lumen Patent Firm

(57) ABSTRACT

A probe card assembly and associated processes of forming them may include a wiring substrate with a first surface and an opposite surface, an electrically conductive first via comprising electrically conductive material extending into the wiring substrate from the opposite surface and ending before reaching the first surface, and a plurality of electrically conductive second vias, and a custom electrically conductive terminal disposed on the first surface such that said custom terminal covers the first via and contacts one of the second vias adjacent to said first via without electrically contacting the first via. Each of the second vias may be electrically conductive from the first surface to the opposite surface. The first via may include electrically insulating material disposed within a hole in the first via.

20 Claims, 7 Drawing Sheets

WIRING SUBSTRATE WITH FILLED VIAS TO ACCOMMODATE CUSTOM TERMINALS

PRIORITY

This patent application claims priority to U.S. Provisional Patent Application No. 61/624,205 filed on Apr. 13, 2012, which is incorporated herein by reference in its entirety.

BACKGROUND

Many billions of devices are sold each year worldwide that incorporate some form of electronics. Electronic circuits often include integrated circuits and integrated circuit chips used with printed circuit boards. The various electronic devices are often tested to ensure functionality and quality control in the manufacturing. Various designs for testing the electronic devices and components of the electronic devices are used for the many different designs of the electronic devices.

Figure 1A:
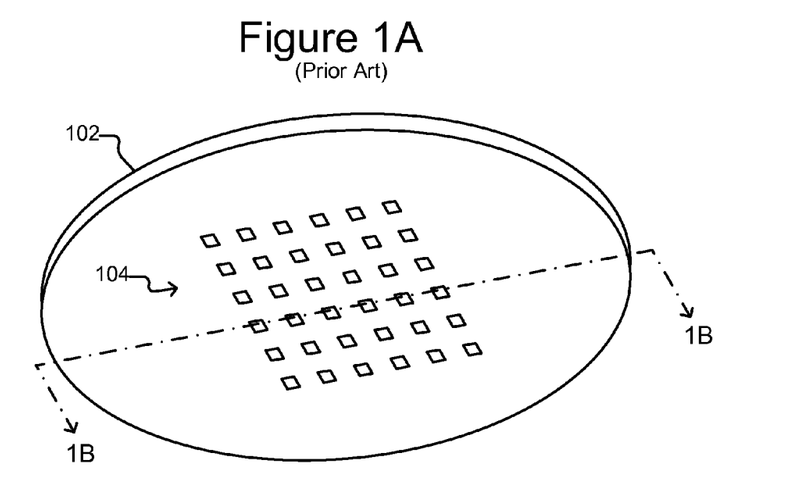
FIGS. 1A and 1B illustrate an example of a prior art wiring substrate with through vias electrically connecting terminals on opposing surfaces of the wiring substrate.
Figure 1B:
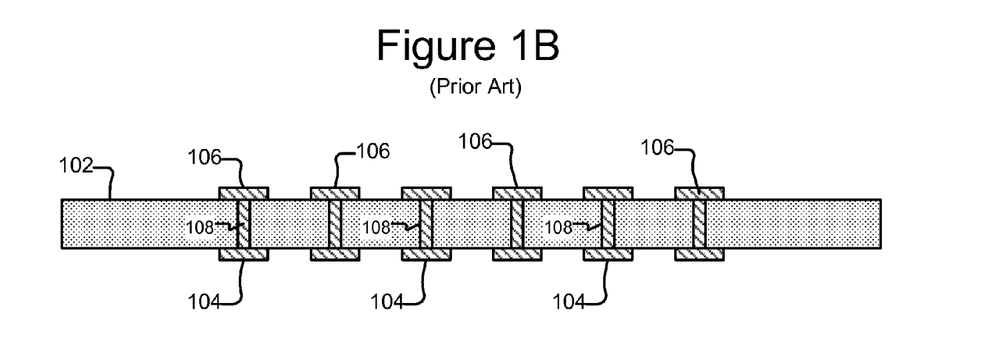

FIGS. 1A and 1B illustrate an example of a prior art wiring substrate 102 (e.g., a printed circuit board) used in probe cards for testing electronic devices. The wiring substrate 102 includes electrically conductive terminals 104 on one side, electrically conductive terminals 106 on the other side, and electrically conductive vias 108 through the wiring substrate 102 connecting the terminals 104 to the terminals 106. Typically, individual terminals 104 on one side of the wiring substrate 102 can be interconnected by electrically conductive traces (not shown), and individual terminals 106 on the other side of the wiring substrate 102 can likewise be interconnected by traces (not shown). Also, electronic circuit elements (not shown) such as resistors, capacitors, inductors, transistors, integrated circuits, or the like, can be attached to individual ones of the terminals 104 or 106. At times, it is desirable to customize a wiring substrate 102 to accommodate such electronic circuit elements. For example, in some circumstances, the size of and/or spacing between terminals 104 and/or 106 required to accommodate an electronic circuit element (not shown) can be greater than to accommodate traces (not shown).

Figure 2:
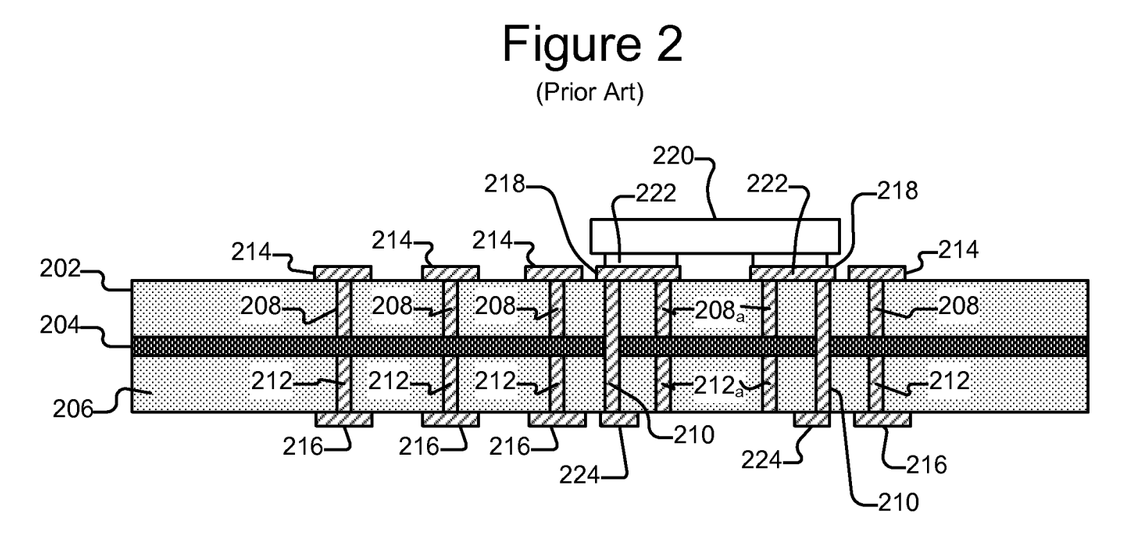
FIG. 2 illustrates a prior art technique of providing custom, oversized terminals for a wiring substrate.

FIG. 2 illustrates an example of a prior art technique for utilizing two stock wiring substrates 202, 206 having stock vias 208, 212 for stock terminals 214, 216 to accommodate an electronic circuit element 220 that requires larger terminals 218 than the stock terminals 214. In the example shown in FIG. 2, it is assumed that larger terminals 218 are required on the first wiring substrate 202 to accommodate the inputs and/or outputs (hereinafter the input/outputs) 222 of the electronic element 220. It is also assumed that the terminals 218 are larger than the stock terminals 214 on the first wiring substrate 202. As shown, an insulating layer 204 is disposed between and attached to the wiring substrates 202 and 206, and new vias 210 are provided through both wiring substrates 202, 206 and the insulating layer 204 to connect the larger terminals 218 on the first substrate 202 to special terminals 224 on the second substrate 206. The input/outputs 222 of the electronic circuit element 220 can be attached to the larger terminals 218 on the first wiring substrate 202. Because the terminals 218 are larger than the stock terminals 214, in the example shown in FIG. 2, each terminal 218 overlaps one of the stock vias $208_a$ in the first wiring substrate 202. The insulating layer 204 ensures that the overlapped vias $208_a$ are not electrically connected to a corresponding via $212_a$ in the second substrate 206 and there is thus no danger of those vias $208_a/212_a$ providing an unintended electrical connection to the input/outputs 222 of the electronic circuit element 220.

Although the technique in FIG. 2 allows for the placement of larger terminals 218 on the first wiring substrate 202 to accommodate the requirements of the input/outputs 222 of the electronic circuit element 220, two wiring substrates 202, 206 and an insulating layer 204 are required, and additional elements (not shown) must be provided for connecting other vias 208 in the first wiring substrate 202 to corresponding vias 212 in the second wiring substrate 206. Embodiments of the present invention provide improvements in fields pertaining to wiring substrates, which can overcome one or more of the foregoing problems in the prior art illustrated in FIG. 2 and/or other problems.

BRIEF SUMMARY

In some embodiments, processes for providing a custom electrically conductive terminal on a first surface of a wiring substrate having electrically conductive vias from the first surface to an opposite surface may include forming a hole at a first one of the vias from the first surface into the wiring substrate and thereby removing all electrically conductive material of the first via in a gap from the first surface into the wiring substrate. Additionally, such processes may include depositing an electrically insulating material into the hole such that the electrically insulating material is disposed between all remaining electrically conductive material of the first via and first surface of the wiring substrate, and providing the custom terminal on the first surface of the wiring substrate and the insulating material such that the custom terminal contacts a second via adjacent to the first via but overlaps without contacting said first via.

The custom terminal may overlaps the first and second vias and also a third one of the vias. The custom terminal may be electrically connected to only the second via. The process may also include forming a second hole at the third via from the first surface into the wiring substrate and thereby removing all electrically conductive material of the third via in a second gap extending from the first surface into the wiring substrate. The process may also further include depositing the electrically insulating material into the second hole such that the electrically insulating material is disposed between all remaining electrically conductive material of the third via and the first surface of the wiring substrate. The wiring substrate may be used in a test of electronic devices.

In some embodiments, a probe card assembly may include electrically conductive probes extending from a probe substrate and disposed to contact terminals of an electronic device to be tested, and a wiring substrate comprising an electrical interface to a tester for controlling testing of the electronic device, wherein the interface is electrically connected to the probes. The wiring substrate may further comprise a first surface and an opposite surface, an electrically conductive first via comprising electrically conductive material extending into the wiring substrate from the opposite surface and ending before reaching the first surface, a plurality of electrically conductive second vias, wherein each of said second vias may be electrically conductive from said first surface to said opposite surface, and a custom electrically conductive terminal disposed on said first surface such that said custom terminal covers said first via and contacts one of said second vias that is adjacent to said first via without electrically contacting said first via.

The first via may include electrically insulating material disposed within a hole in the first via.

DETAILED DESCRIPTION OF EXEMPLARY EMBODIMENTS

This specification describes exemplary embodiments and applications of wiring substrates with filled vias to accommodate custom terminals. The invention, however, is not limited to the exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As used herein, "substantially" means sufficient to work for the intended purpose. The term "ones" means more than one.

In some embodiments, a wiring substrate may include electrically conductive vias sized and spaced for standard electrically conductive terminals of a first size and spacing may be modified to accommodate custom terminals of a different size. FIGS. 3-9 illustrate an example of a process of back filling selected electrically conductive vias 308 in a wiring substrate 302 with an electrically insulating material 602 to accommodate custom terminals 804 configured for an electronic circuit element 902 according to some embodiments. FIG. 10 illustrates an example of an application in which the finished wiring substrate 900 of the process of FIGS. 3-9 can be used with a probe card assembly 1008.

Figure 3:
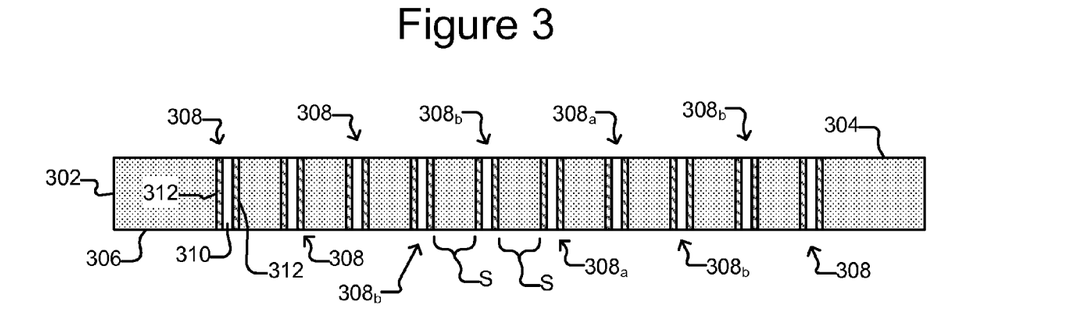
FIGS. 3-9 illustrate an example of a process for providing a wiring substrate with custom terminals according to some embodiments of the invention.

FIG. 3 illustrates an example of a wiring substrate 302 having outer surfaces 304 and 306 and electrically conductive vias 308 from the first surface 304 to the second surface 306. The wiring substrate 302 can be electrically insulating and can be, for example, a wiring board such as a printed circuit board. Each via 308 can comprise a conductive material (e.g., an electrically conductive material such as copper, gold, silver, or the like). In FIG. 3, each via 308 is illustrated as comprising a though hole 310 and electrically conductive side walls 312. The side walls 312 can comprise, for example, the conductive material mentioned above. Alternatively such conductive material can completely fill each via 308 such that there is no through hole 310. Regardless, a spacing S between adjacent vias 308 can be selected to accommodate standard terminals 802 on the first surface 304 and standard terminals 806 on the second surface 306 of the wiring substrate 302. (See FIGS. 8 and 9.) The terminals 802 and 806 are termed "standard" because they are sized to correspond to the spacing S between adjacent vias 308. That is, a "standard terminal," as used herein, is sized sufficiently smaller than the spacing S between adjacent terminals 802 that one standard terminal (e.g., one of the standard terminals 802) can be disposed on a surface (e.g., 304) of the wiring substrate 302 connected to one of the vias 308, and a second standard terminal (e.g., another one of the standard terminals 802) can be disposed on the same surface of the wiring substrate 302 connected to a second one of the vias 308 that is immediately adjacent the first one of the vias 308. Although the spacing S is illustrated in FIG. 3 as being the same for each pair of adjacent vias 308, the spacing S between different pairs of adjacent vias 308 can alternatively be different.

Figure 6:
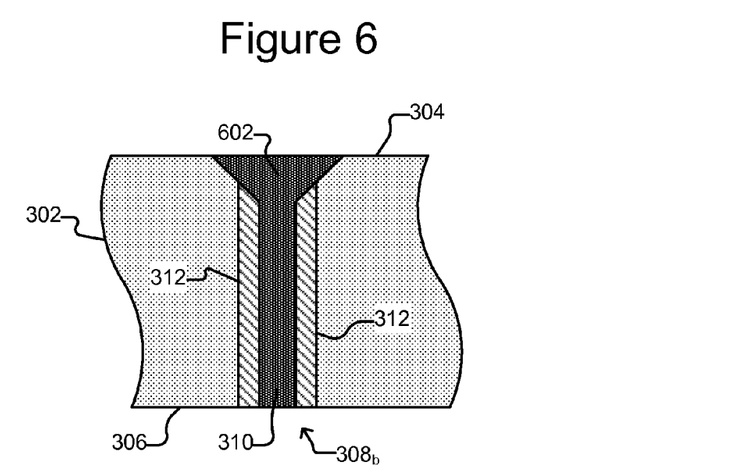
Figure 7:
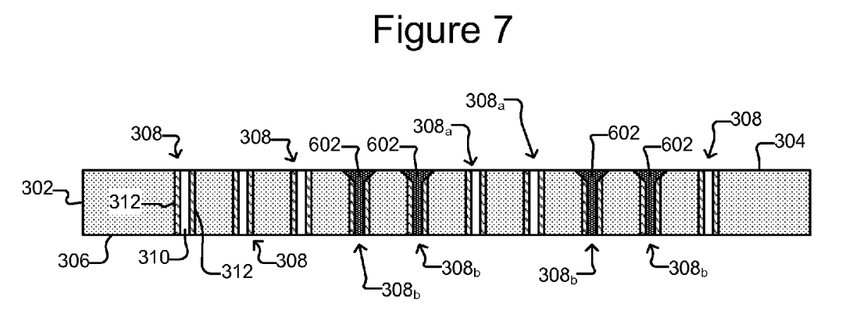
Figure 8:
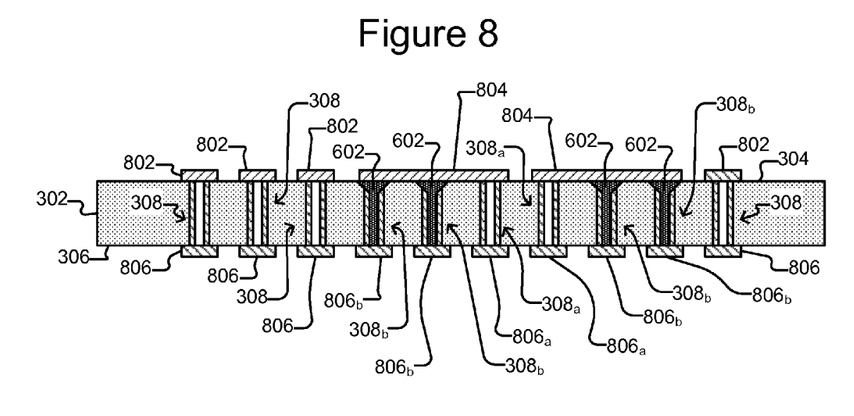
Figure 9:
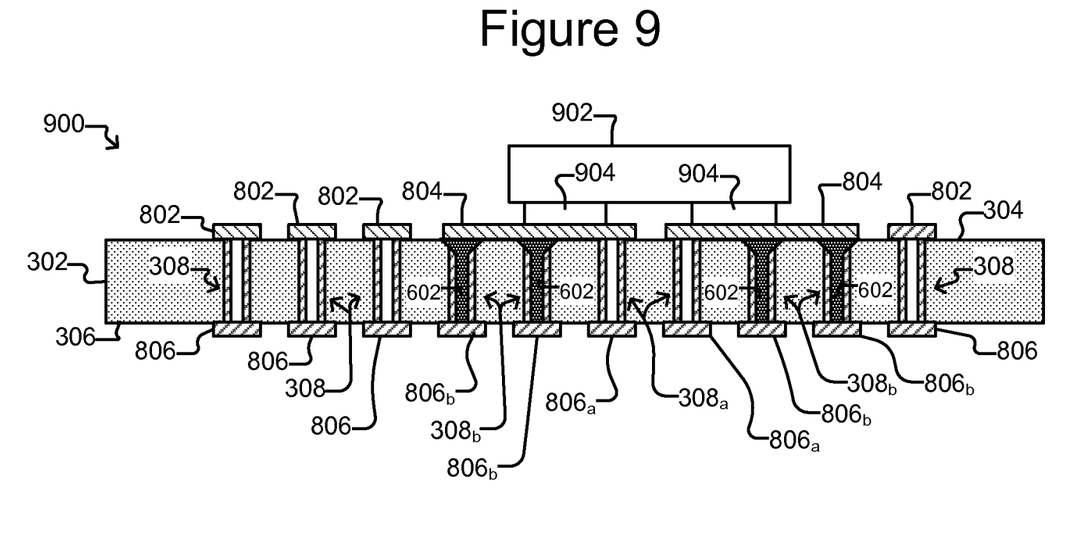
Figure 10:
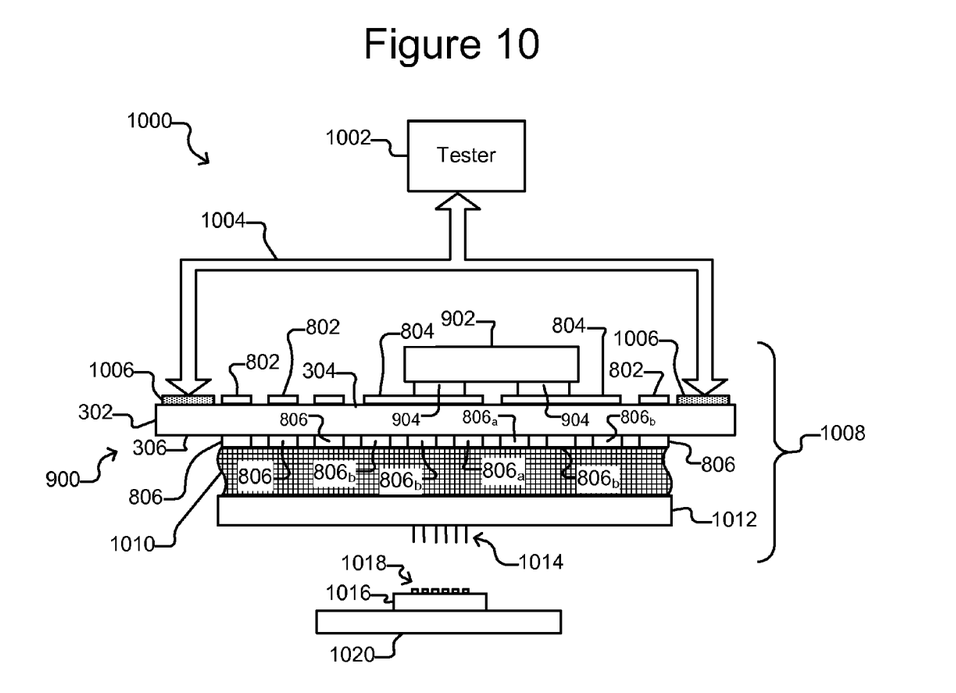
FIG. 10 illustrates an example of a probe card assembly with a wiring substrate customized according to the process illustrated in FIGS. 3-9 according to some embodiments o the invention.

In the example, illustrated in FIGS. 3-9, it is assumed for ease of illustration and discussion that custom terminals 804 (see FIGS. 8 and 9) may be provided on the first surface 304 of the wiring substrate 302, and each such custom terminal 804 may be connected at the first surface 304 to one of the vias $308_a$. (A via 308 to which a custom terminal 804 is to be connected is designated $308_a$.) As used herein, a "custom terminal," such as 804 in FIGS. 8 and 9, is a terminal that is sized differently than any of the "standard terminals," such as 802 and 806 as discussed above. For example, a custom terminal 804 can be larger than a standard terminal, which is the case in the example illustrated in FIGS. 3-9. In some embodiments, terminals 804 larger than the standard terminals 802 may be needed because the inputs and/or outputs 904 of an electronic circuit element 902 (see FIG. 9) to be attached to the wiring substrate 302 requires terminals that are larger than the standard terminals 802 that correspond to the spacing S between adjacent vias 308.

As shown, each of the custom terminals 804 in the example illustrated in FIGS. 3-9 can be sufficiently larger than the spacing S between adjacent vias 308 such that a custom terminal 804 on the first surface 304 overlaps more than one of the vias 308. (As mentioned, a via 308 to which a custom terminal 804 is to be connected is designated $308_a$ in FIGS. 3-9, and vias 308 that a custom terminal 804 overlaps are designated $308_b$.) In the illustrated example, each custom terminal 804 overlaps two vias $308_b$, but a custom terminal 804 can alternatively overlap fewer or more vias $308_b$. In such instances, it may be desirable to ensure that the larger terminals 804 only contact one of the vias $308_a$ and not several as would be the case without modifying the vias $308_b$.

Figure 4:
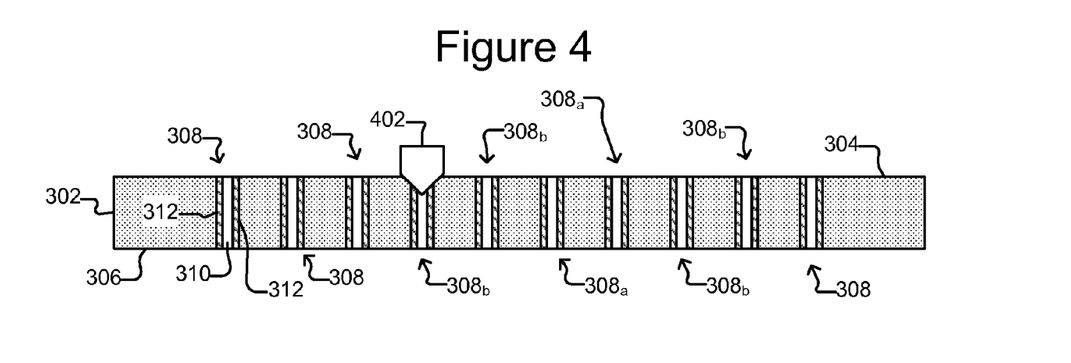
Figure 5:
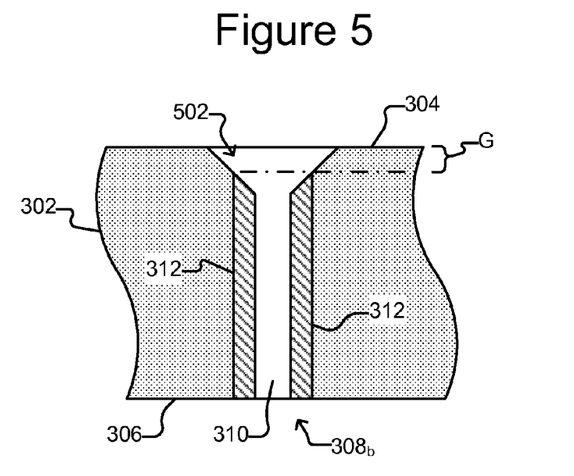

Referring to FIGS. 4 and 5, a hole 502 can be formed from the first surface 304 into the wiring substrate 202 at one of the overlapped vias $308_b$. For example, a drilling tool 402 can drill the hole 502 into the first surface 304 and the via $308_b$. As shown in FIG. 5, this can create a hole 502 partially into the first surface 304 of the wiring substrate 302 at the via $308_b$. The hole 502 can be sufficiently deep into the first surface 304 to remove all of the conductive material of the via $308_b$ in a gap G between the first surface 304 and the conductive material of the via $308_b$. In the example shown in FIG. 5, the hole 502 can remove enough of the conductive sidewalls 312 of the via $308_b$ to create a gap G between the conductive sidewalls 312 and the first surface 304 of the wiring substrate 302. The gap G is thus not electrically conductive, and may be large enough to prevent electrical conductivity between the conductive sidewalls 312 and any contacts placed on the first surface 304 of the wiring substrate 302.

As shown in FIG. 6, the hole 502 can be filled with an electrically insulating material 602. For example, the hole 502 can be overfilled with the insulating material 602, and excess insulating material 602 can be removed so that the top (in FIG. 6) surface of the insulating material 602 is generally planar with the first surface 304 of the wiring substrate 302. This can result in the conductive sidewalls 312 of the via $308_b$ being electrically insulated from the first surface 304 of the wiring substrate 302 as shown in FIG. 6.

Each of the vias $308_b$ can be drilled as shown in FIGS. 4 and 5 and filled with an insulating material 602 as shown in FIG. 6 such that each of the overlapped vias $308_b$ is electrically insulated from the first surface 304 of the wiring substrate 302 as shown in FIG. 7. Although the insulating material 602 is illustrated in FIGS. 6-9 as also filling the through hole 310 of a via $308_b$, the insulating material 602 can alternatively fill only the hole 502 or only the hole 502 and part of the through hole 310.

As should be apparent, of the vias $308_a$ and $308_b$ that correspond to a custom terminal 804, only the via $308_a$ is electrically conductive from the second surface 306 to the first surface 304 of the wiring substrate 302. As illustrated in FIG. 8, a custom terminal 804 can be provided on the first surface 304 of the wiring substrate in contact with—and thus electrically connected to—a via $308_a$ but not in contact with nor electrically connected to the vias $308_b$ even though the custom terminal 804 overlaps the vias $308_b$. As also shown in FIG. 8, standard terminals 802 can be provided on the first surface 304 in contact with—and thus electrically connected to—the vias 308. Similarly, standard terminals 806 can be provided on the second surface 306 of the wiring substrate 302 in contact with—and thus electrically connected to—the vias 308 as also shown in FIG. 8. As should be apparent, however, the standard terminals $806_b$ in contact with vias $806_b$ at the second surface 306 are not electrically connected to a corresponding custom terminal 804. Rather, only a standard terminal $806_a$ in contact with a via $806_a$ at the second surface 406 is electrically connected to a corresponding custom terminal 804.

The standard terminals 802 and custom terminals 804 can be provided on the first surface 304 of the wiring substrate 306 in any suitable manner. For example, the standard terminals 802 and custom terminals 804 can be formed on the first surface 304 by depositing conductive material (e.g., a conductive metal such as copper, gold, silver, or the like) onto the first surface 304. In some examples, the standard terminals 802 and custom terminals 804 can be formed by depositing such a conductive material on the first surface 304 and then selectively removing part of the conductive material from the first surface 304, leaving the terminals 802 and 804. The standard terminals 806 can be provided on the second surface 306 of the wiring substrate 302 in any of the ways that the terminals 802 and 804 can be provided on the first surface 304.

As noted, a purpose of the custom terminals 804 can be to accommodate an electronic circuit element 902, which as shown in FIG. 9 can be attached to the custom terminals 804. For example, one or more inputs and/or outputs (herein after an input/output) 904 of the electronic circuit element 902 can be attached—and thus electrically connected—to the custom terminals 804. The electronic circuit element 902 can be any type of circuit element such as, without limitation, a resistor, a capacitor, an inductor, a transistor, an integrated circuit, or the like. As should be apparent, although a custom terminal 804 to which an input/output 904 of the electronic circuit element 902 is connected may overlap more than one via $308_a$ and $308_b$, the input/output 904 may thereby be connected to only one standard terminal 806 at the second surface 306 of the wiring substrate 302.

The process illustrated in FIGS. 3-9 is an example only, and variations are, of course, possible. For example, the conductive material of the side walls 312 of a via 308 can completely fill a via 308, and there thus can be no through hole 310. In such embodiments, the side walls 312 may be reduced to form a hole 502 and provide a space G to prevent conductivity in certain of the vias 308 as desired. As another example, a custom terminal 304 can overlap more or fewer than three vias 308. As yet another example, there need not be a standard terminal 802 provided on the first surface 304 at every via 308, nor need there be a standard terminal 806 provided on the second surface 306 at every via 308. As yet another example, there can be more or fewer vias 308 than shown in FIGS. 3-9, and there can be more or fewer than two custom terminals 804 and/or more than one electronic circuit element 902. As still another example, the electronic circuit element 902 can have more or fewer than two input/outputs 904. As another example, one or more custom terminals like 804 can also be provided on the second surface 306.

There are many possible applications for a customized wiring substrate produced by the process illustrated in FIGS. 3-9. FIG. 10 illustrates one such application in which the customized wiring substrate 900 of FIG. 9 is a wiring substrate in a probe card assembly 1008.

FIG. 10 illustrates an example of a test system 1000 for testing an electronic device 1016 in which electrically conductive probes 1014 can be brought into contact with terminals 1018 of the electronic device 1016 to test the electronic device 1016 according to some embodiments of the invention. As shown, the test system 1000 can include a tester 1002, communications channels 1004, a probe card assembly 1008, and a stage 1020. The tester 1002 can comprise a computer, a computer system, or other electronic control equipment, and can be configured to control testing of the electronic device 1016. The communications channels 1004 can comprise electrical connections (e.g., cables, wires, wireless channels, or the like) for conveying electrical signals, power, and the like from and to the tester 1002.

The probe card assembly 1008 can comprise an electrical interface 1006 (e.g., zero-force-insertion electrical connectors, pogo-pin pads, or the like) that connects to the communications channels 1004. As shown, the probe card assembly 1008 can also comprise the customized wiring substrate 900 of FIG. 9 (including any of the variations and modifications discussed herein). The electrical interface 1006 can be disposed on the first surface 304 of the wiring substrate 302, and the wiring substrate 302 can include electrical connections (e.g., electrically conductive traces or the like) (not shown) from the interface 1006 to one or more of the standard terminals 802 and/or custom terminals 804.

The probe card assembly 1008 can also comprise an electrical connector 1010 (e.g., an interposer, flexible electrical connections, solder, or the like), which can provide electrical connections (not shown) from one or more of the terminals 806 on the second surface 306 of the wiring substrate 302 to a probe substrate 1012, which can in turn, provide electrical connections to electrically conductive probes 1014 that extend from the probe substrate 1012. Thus, the communications channels 1004 can provide individual electrical connections from the tester 1002 to the interface 1006 on the probe card assembly 1008, and the probe card assembly 1008 can provide individual electrical connections from the interface 1006 through the wiring substrate 900, connector 1010, and probe substrate 1012 to the probes 1014.

The probe card assembly 1008 can be fastened together and mounted as a unit to a housing (not shown) such as the housing of a test prober (not shown). The stage 1020 can be located in such a housing (not shown). The stage 1020 and/or the probe card assembly 1008 can be moveable to align ones of the probes 1014 with ones of the terminals 1018 and then bring the ones of the probes 1014 into contact with the ones of the terminals 1018 and thereby electrically connect the probes 1014—and thus the tester 1002—to the electronic device 1016. The tester 1002 can then provide test signals, power, and/or the like through the communications channels 1004 and probe card assembly 1008 (including the probes 1014) to the terminals 1018 of the electronic device 1016. Response signals generated by electronic device 1016 and output through terminals 1018 can be sensed by the probes 1014 and provided through the probe card assembly 1008 and communications channels 1004 to the tester 1002. The tester 1002 can analyze the response signals to determine whether the electronic device 1016 responded properly to the test signals and, consequently, whether electronic device 1016 passes or fails the testing. The tester 1002 can alternatively or in addition perform tasks other than testing the electronic device 1016. For example, the tester 1002 can operate the electronic device 1016, for example, to burn in the electronic device.

The electronic device 1016 can be any electronic device or devices to be tested, including without limitation one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronic devices, one or more printed circuit boards, or any other type of electronic device or devices. As mentioned, in some embodiments, the electronic device 1016 can be one or more semiconductor dies, and the probes 1014 (and thus probe 100 including any disclosed variation thereof) can be sized to contact terminals (e.g., bond pads) of semiconductor dies.

The test system 1000 illustrated in FIG. 10 is an example only, and variations are contemplated. For example, the probe card assembly 1008 can include additional elements not shown in FIG. 10. As another example, the probe card assembly 1008 need not include all of the elements shown in FIG. 10. For example, connector 1010 need not be included, and the probe substrate 1014 can be connected directly to the wiring substrate 900. As another example, some or all of the tester 1002 can be disposed on the probe card assembly 1008 (e.g., on the wiring substrate 900 and/or probe substrate 1012).

Although specific embodiments and applications have been described in this specification, these embodiments and applications are exemplary only, and many variations are possible. In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

I claim:

1. A probe card assembly comprising:
   electrically conductive probes extending from a probe substrate and disposed to contact terminals of an electronic device to be tested; and
   a wiring substrate comprising an electrical interface to a tester for controlling testing of said electronic device,
   wherein said interface is electrically connected to said probes, and
   wherein said wiring substrate further comprising:
     a first surface and an opposite surface;
     an electrically conductive first via comprising electrically conductive material extending into said wiring substrate from said opposite surface and ending before reaching said first surface;
     a plurality of electrically conductive second vias, wherein each of said second vias are electrically conductive from said first surface to said opposite surface; and
     a custom electrically conductive terminal disposed on said first surface such that said custom terminal covers and contacts said first via without electrically connecting to said first via and covers and contacts and electrically connects to one of said second vias that is adjacent to said first via.

2. The probe card assembly of claim 1, further comprising electrically insulating material disposed in a hole at said first via, said hole extending from said first surface into said wiring substrate between said electrically conductive material of said first via and said first surface.

3. The probe card assembly of claim 1, wherein said custom terminal covers a third electrically conductive via.

4. The probe card assembly of claim 3, wherein said custom terminal is electrically connected only to said one of said second vias.

5. The probe card assembly of claim 3, further comprising a second hole at said third via.

6. The probe card assembly of claim 5, wherein the second hole includes electrically insulating material disposed within said second hole.

7. The probe card assembly of claim 1, wherein said custom terminal is electrically connected to said second via but not said first via.

8. The probe card assembly of claim 1, wherein said wiring substrate further comprises a hole filled with an electrically insulating material extending from said first surface to said first via.

9. The probe card assembly of claim 8, wherein:
   said custom terminal is disposed on said first surface and said insulating material, and
   said custom terminal is electrically insulated from said first via by said insulating material.

10. The probe card assembly of claim 9, wherein said first via is substantially perpendicular to said first surface and said opposite surface.

11. The probe card assembly of claim 1, wherein said wiring substrate further comprises an electrically insulating gap in said wiring substrate between said first via and said custom terminal.

12. The probe card assembly of claim 11, wherein:
said custom terminal is disposed on said first surface over and in contact with said one of said second vias, and
said custom terminal is also disposed on said first surface over said first via but said gap electrically insulates said custom terminal from said first via.

13. The probe card assembly of claim 12, wherein said gap comprises:
a hole extending from said first surface into said wiring substrate to said first via, and electrically insulating material disposed in said hole.

14. The probe card assembly of claim 13, wherein said electrically insulating material fills said hole.

15. The probe card assembly of claim 14, wherein said hole is wider in a direction parallel to said first surface than said first via.

16. The probe card assembly of claim 1, wherein a dimension of an input and/or output of an electronic circuit element in direct contact with said custom terminal is greater than a corresponding dimension between said first via and said one of said second vias.

17. The probe card assembly of claim 1, wherein an area of an input and/or output of an electronic circuit element in direct contact with said custom terminal is greater than a corresponding area between said first via and said one of said second vias.

18. The probe card assembly of claim 17, wherein said area of said input and/or output in direct contact with said custom terminal and said corresponding area between said first via and said one of said second vias are substantially parallel to each other and said first surface of said wiring substrate.

19. The probe card assembly of claim 1, wherein an input and/or output of an electronic circuit element is electrically connected to said one of said second vias but not said first via.

20. A probe card assembly, comprising:
electrically conductive probes extending from a probe substrate and disposed to contact terminals of an electronic device to be tested; and
a wiring substrate comprising an electrical interface to a tester for testing the electronic device, the interface being electrically connected to the probes, wherein the wiring substrate comprises:
a first surface and a second surface opposite the first surface;
a first via comprising an electrically conductive material extending into the wiring substrate from the second surface and ending before reaching the first surface;
a plurality of second vias being electrically conductive from the first surface to the second surface; and
a custom, electrically-conductive terminal disposed on the first surface so that the custom terminal covers and contacts the first via without being electrically connected to the first via and covers and contacts and electrically connects to a second via that is adjacent to the first via.

* * * * *